US006462919B1

(12) United States Patent
Mack et al.

(10) Patent No.: US 6,462,919 B1
(45) Date of Patent: Oct. 8, 2002

(54) SPIN VALVE SENSOR WITH EXCHANGE TABS

(75) Inventors: Anthony M. Mack, Minneapolis; Sining Mao, Savage, both of MN (US); Michael A. Seigler, Bridgeville, PA (US); Nurul Amin, Burnsville, MN (US); Taras G. Pokhil, Arden Hills, MN (US); Ananth Naman, Edina, MN (US); Jin Li; Zheng Gao, both of Bloomington, MN (US); Edward S. Murdock, Edina, MN (US); Jumna P. Ramdular, Brooklyn Park, MN (US); Timothy Radke, Eagan, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/442,798

(22) Filed: Nov. 18, 1999

Related U.S. Application Data

(60) Provisional application No. 60/131,850, filed on Apr. 28, 1999, provisional application No. 60/131,463, filed on Apr. 28, 1999, and provisional application No. 60/146,227, filed on Jul. 28, 1999.

(51) Int. Cl.⁷ ............................. G11B 5/127; G11B 5/33
(52) U.S. Cl. .................................................. 360/327.3
(58) Field of Search ................................. 360/313, 314, 360/315, 316, 317, 318, 318.1, 319, 320, 321, 322, 323, 324, 324.1, 324.11, 324.12, 324.2, 325, 326, 327, 327.1, 327.11, 327.2, 327.21, 327.22, 327.23, 327.24, 327.3, 327.31, 327.32, 327.33, 126

(56) References Cited

U.S. PATENT DOCUMENTS

| | | | |
|---|---|---|---|
| 4,103,315 A | 7/1978 | Hempstead et al. | 360/110 |
| 4,436,593 A | 3/1984 | Osborne et al. | 204/15 |
| 4,663,685 A | 5/1987 | Tsang | 360/327.32 |
| 4,713,708 A | 12/1987 | Krounbi et al. | 360/327.32 |

(List continued on next page.)

OTHER PUBLICATIONS

W.F. Englehoff, Jr., et al., Specular Electron Scattering in Giant Magnetoresistance Spin Valves, IEEE Transactions on Magnetics, vol. 33, No. 5, Sep. 1997, 3 pages.
J.C.S. Kools, et al., Process monitoring of spin–valve GMR deposition, IEEE Transactions on Magnetics, vol. 34, No. 4, Jul. 1999, 3 pages.
H.J.M. Swagten, et al., Specular Reflection in Spin Valves Bounded by NiO layers, IEEE Transactions on Magnetics, vol. 34, No. 4, Jul. 1999, 6 pages.
C. Tsang, Unshielded MR elements with patterned exchange–biasing, IEEE Transactions on Magnetics, vol. 25 (5), pp. 3692–3694 (1989).
Juan J. Fernandez–de–Castro, et al., IEEE Transactions on Magnetics, Intermag '96.
Magnetoresistive heads by John Mallison, Academic Press, London (1996).
Sining Mao, et al., Appl. Phys. Lett. 69, 2593 (1996).
Intermag '96, IEEE Transactions on Magnetics.
Taras Pokhl, et al., MMM paper (Nov. 1998, Miami, FL), published in Journal of Applied Physics (Apr. 15, 1999).

*Primary Examiner*—Allen Cao
*Assistant Examiner*—Julie Anne Watko
(74) *Attorney, Agent, or Firm*—Kinney & Lange, P. A.

(57) ABSTRACT

A spin valve sensor is disclosed that comprises a first layer of ferromagnetic material and a second layer of ferromagnetic material. A first layer of non-ferromagnetic material is positioned between the first and second layers of ferromagnetic material. A pinning layer is positioned adjacent to the first layer of ferromagnetic material such that the pinning layer is in contact with the first layer of ferromagnetic material. The spin valve includes synthetic antiferromagnetic bias means extending over passive end regions of the second layer of ferromagnetic material for producing a longitudinal bias in the passive end regions of a level sufficient to maintain the passive end regions in a single domain state. A method for forming a spin valve sensor with exchange tabs is also disclosed.

18 Claims, 11 Drawing Sheets

U.S. PATENT DOCUMENTS

| | | | |
|---|---|---|---|
| 4,785,366 A | | 11/1988 | Krounbi et al. ......... 360/327.32 |
| 5,206,590 A | | 4/1993 | Dieny et al. ................. 324/252 |
| 5,465,185 A | * | 11/1995 | Heim et al. ............... 360/324.1 |
| 5,557,492 A | * | 9/1996 | Gill et al. .................... 360/319 |
| 5,578,342 A | | 11/1996 | Tran et al. ................... 427/131 |
| 5,739,987 A | * | 4/1998 | Yuan et al. ............ 360/327.32 |
| 5,751,521 A | * | 5/1998 | Gill ............................. 360/314 |
| 5,753,131 A | | 5/1998 | Choukh et al. ................ 216/22 |
| 5,804,085 A | | 9/1998 | Wu et al. ...................... 216/22 |
| 5,863,448 A | | 1/1999 | Otani et al. .................... 216/22 |
| 5,867,889 A | | 2/1999 | Dovek et al. ............. 29/603.13 |
| 5,901,018 A | * | 5/1999 | Fontana, Jr. et al. ..... 360/324.2 |
| 5,901,432 A | | 5/1999 | Armstrong et al. ....... 29/603.14 |
| 5,949,623 A | | 9/1999 | Lin ........................ 360/324.12 |
| 5,966,012 A | * | 10/1999 | Parkin ........................ 324/252 |
| 6,005,753 A | * | 12/1999 | Fontana, Jr. et al. ..... 360/324.2 |
| 6,040,961 A | * | 3/2000 | Gill ........................ 360/324.11 |
| 6,185,077 B1 | * | 2/2001 | Tong et al. ............... 360/324.1 |
| 6,185,079 B1 | * | 2/2001 | Gill ........................ 360/324.2 |
| 6,201,673 B1 | * | 3/2001 | Rottmayer et al. .... 360/324.12 |
| 6,204,071 B1 | * | 3/2001 | Ju et al. ......................... 438/3 |
| 6,226,218 B1 | * | 7/2001 | Carey et al. ............ 360/324.12 |

\* cited by examiner

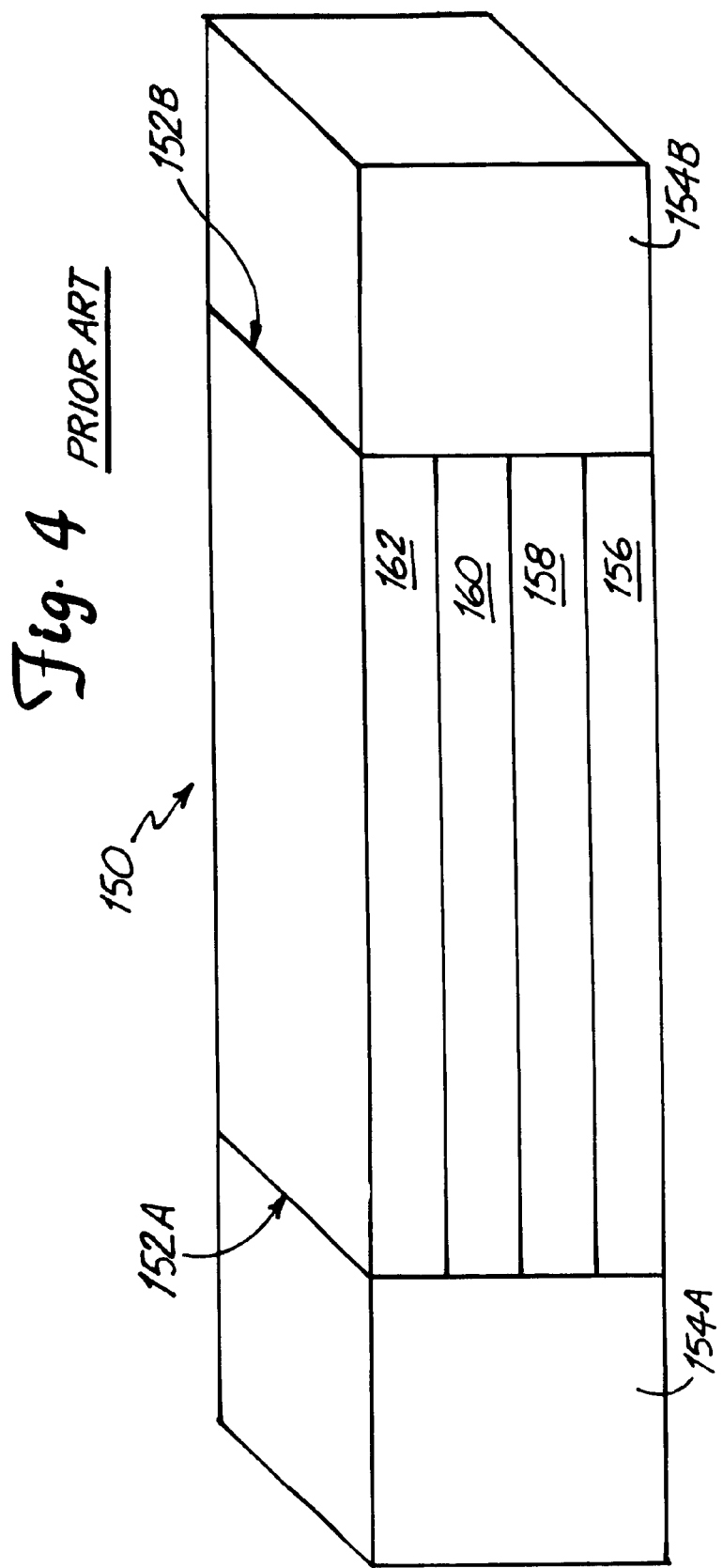

SPIN VALVE SENSOR WITH EXCHANGE TABS

CROSS-REFERENCE TO RELATED APPLICATION(S)

This application claims the benefit of the filing date of U.S. provisional application Ser. No. 60/131,850 entitled "METHOD OF MAGNETIC SENSOR STABILIZATION USING ANTIFERROMAGNETIC EXCHANGE BIAS WITH A SELF-ALIGNED REMOVAL MECHANISM," which was filed Apr. 28, 1999, U.S. provisional application Ser. No. 60/131,463 entitled "STRUCTURES TO REDUCE SIDE READING IN SPIN VALVE SENSORS USING ANTIFERROMAGNETIC LONGITUDINAL BIAS," which was filed Apr. 28, 1999, and U.S. provisional application Ser. No. 60/146,227 entitled "FREEING OF THE FREELAYER IN AN EXCHANGE TAB SPIN-VALVE," which was filed Jul. 28, 1999.

BACKGROUND OF THE INVENTION

The present invention relates generally to magnetoresistive read sensors for use in magnetic read heads. In particular, the present invention relates to a spin valve head with antiferromagnetic exchange stabilization and method for forming such a spin valve.

A magnetic read head retrieves magnetically-encoded information that is stored on a magnetic medium or disc. The magnetic read head is typically formed of several layers that include a top shield, a bottom shield, and a read sensor positioned between the top and bottom shields. The read sensor is generally a type of magnetoresistive sensor, such as a giant magnetoresistive (GMR) read sensor. The resistance of a GMR read sensor fluctuates in response to a magnetic field emanating from a magnetic medium when the GMR read sensor is used in a magnetic read head and positioned near the magnetic medium. By providing a sense current through the GMR read sensor, the resistance of the GMR read sensor can be measured and used by external circuitry to decipher the information stored on the magnetic medium.

A common GMR read sensor configuration is the GMR spin valve configuration in which the GMR read sensor is a multi-layered structure formed of a ferromagnetic free layer, a ferromagnetic pinned layer and a nonmagnetic spacer layer positioned between the free layer and the pinned layer. The magnetization direction of the pinned layer is fixed in a predetermined direction, generally normal to an air bearing surface of the GMR spin valve, while a magnetization direction of the free layer rotates freely in response to an external magnetic field. An easy axis of the free layer is generally set normal to the magnetization direction of the pinned layer. The resistance of the GMR read sensor varies as a function of an angle formed between the magnetization direction of the free layer and the magnetization direction of the pinned layer. This multi-layered spin valve configuration allows for a more pronounced magnetoresistive effect than is possible with anisotropic magnetoresistive (AMR) read sensors, which generally consist of a single ferromagnetic layer.

Typically, the magnetization of the pinned layer is fixed in the predetermined direction by exchange coupling an antiferromagnetic layer to the pinned layer. The antiferromagnetic layer is positioned upon the pinned layer such that the antiferromagnetic layer and the free layer form distal edges of the GMR spin valve. The spin valve is then heated to a temperature greater than a Néel temperature of the antiferromagnetic layer. Next, a magnetic field oriented in the predetermined direction is applied to the spin valve, thereby causing the magnetization direction of the pinned layer to orient in the direction of the applied magnetic field. The magnetic field may be applied to the spin valve before the spin valve is heated to the temperature greater than the Néel temperature of the antiferromagnetic layer. While continuing to apply the magnetic field, the spin valve is cooled to a temperature lower than the Neel temperature of the antiferromagnetic layer. Once the magnetic field is removed from the spin valve, the magnetization direction of the pinned layer will remain fixed, as a result of the exchange with the antiferromagnetic layer, so long as the temperature of the spin valve remains lower than the Neel temperature of the antiferromagnetic layer.

The free layer of a spin valve sensor must be stabilized against the formation of edge domain walls because domain wall motion results in electrical noise, which makes data recovery impossible. A common way to achieve stabilization is with a permanent magnet abutted junction design. Permanent magnets have a high coercive field (i.e., are hard magnets). The field from the permanent magnets stabilizes the free layer and prevents edge domain formation, and provides proper bias.

However, there are several problems with permanent magnet abutted junctions. To properly stabilize the free layer, the permanent magnets must provide more flux than can be closed by the free layer. This undesirable extra flux stiffens the edges of the free layer so that the edges cannot rotate in response to flux from the media, and may also cause shield saturation which adversely affects the ability of the sensor to read high data densities. The extra flux from the permanent magnets may produce multiple domains in the free layer and may also produce dead regions which reduce the sensitivity of the sensor. The junction between the permanent magnet and the various layers must be carefully engineered to minimize the stray flux as well as to minimize the junction resistance. Also, a junction of dissimilar metals can cause unwanted strain in the sensor. The free layer will respond to the strain unless the magnetostriction is exactly zeroed. Another disadvantage of permanent magnet abutted junctions is the nature of hard magnetic materials, which are multi-domained. Variation in grain size and shape leads to a distribution of domain coercivity. Lower coercivity domains may rotate when subjected to external fields. Such a grain near the edge of the free layer could cause domain wall formation and failure.

Tabs of antiferromagnetic material or "exchange tabs" have also been used to stabilize the free layer of magnetic sensors. Exchange tabs are deposited upon the outer regions of the free layer and are exchange coupled thereto. Functions of the exchange tabs include pinning the magnetization of the outer regions of the free layer in the proper direction, preventing the formation of edge domains and defining the width of an active area of the free layer by preventing free layer rotation at the outer regions of the free layer.

There are several advantages to the use of exchange tabs rather than permanent magnet abutted junctions. There is no junction to produce stray magnetic flux or junction resistance. Also, the lack of a junction of abutted, dissimilar metals makes it less likely that high strain will be produced within the sensor. And control is maintained over the anisotropy of the free layer regardless of how narrow the width of the active area is made.

The use of antiferromagnetic exchange tabs in AMR type sensors has been disclosed in U.S. Pat. No. 4,663,685, entitled "MAGNETORESISTIVE READ TRANSDUCER HAVING PATTERNED LONGITUDINAL BIAS", U.S. Pat. No. 4,713,708, entitled "MAGNETORESISTIVE READ TRANSDUCER", and U.S. Pat. No. 5,753,131, entitled "MAGNETORESISTIVE DEVICE AND MANUFACTURING METHOD THEREOF". Longitudinal bias in AMR type sensors is also discussed in U.S. Pat. No. 4,785,366, entitled "MAGNETORESISTIVE READ TRANSDUCER HAVING PATTERNED ORIENTATION OF LONGITUDINAL BIAS".

The use of antiferromagnetic exchange tabs in spin valve type sensors has been disclosed in U.S. Pat. No. 5,206,590, entitled "MAGNETO RESISTIVE SENSOR BASED ON THE SPIN VALVE EFFECT", and U.S. Pat. No. 5,949,623, entitled "MONOLAYER LONGITUDINAL BIAS AND SENSOR TRACKWIDTH DEFINITION FOR OVERLAID ANISOTROPIC AND GIANT MAGNETORESISTIVE HEADS".

Not all antiferromagnetic materials are suitable for use as exchange tabs in spin valve type sensors. Materials such as MnFe and TbCo are too corrosive for head production. MnFe and similar materials also have relatively low blocking temperatures, which is undesirable because the pinned regions of the free layer may become unpinned if the temperature of the sensor is raised above the blocking temperature of the exchange tabs during operation. MnFe and similar materials also have relatively low coupling constants, which results in weaker exchange coupling and higher side readings. Materials such as $Fe_2O_3$ only increase the coercivity of the ferromagnetic layer instead of the pinning field.

The prior art does not disclose an exchange tab structure that makes use of a synthetic antiferromagnet, which provides an increased pinning field and reduced side reading. Furthermore, current methods for forming sensors with exchange tabs are inadequate. A major difficulty in manufacturing sensors with exchange tabs using conventional methods is establishing adequate exchange coupling between the exchange tabs and the free layer. Adequate exchange coupling is difficult to obtain because of the presence of a residue layer. It is often necessary to employ some removal process such as a pre-sputter etch or reactive ion etch on the residue layer to expose a clean, unoxidized surface of the free layer and to establish exchange coupling with deposited exchange tab material. A single monolayer of non-magnetic residue material is sufficient to destroy the exchange coupling. The removal step is problematic, though, because a photo mask is typically present on the residue layer during the removal step. It is extremely difficult to remove residue close to the photo mask, and excess residue is often left near the photo mask. The excess residue near the photo mask prevents proper exchange coupling between exchange tab material and the free layer, which results in widening of the effective width of the sensor and generation of an off-track signal.

The presence of a photo mask causes another problem during the deposition of the exchange tab material. Near the edge of the photo mask, some amount of shadowing is inevitable, causing reduced thickness of exchange tab material near the photo mask. Thus, even if it were possible using conventional techniques to completely remove the residue near the photo mask, the reduced thickness of the exchange tab material near the photo mask would still cause a problem. Since the pinning strength of exchange tabs is strongly dependent on thickness, it is necessary to compensate for the reduced thickness near the photo mask by increasing the overall layer thickness to provide a margin of safety. As the size of recording heads shrink, thinner layers become more attractive. Collimated deposition techniques can be employed to avoid thinning, but such an approach adds an extra constraint to the deposition process. It would be preferable to optimize for material quality with no geometry constraints.

Another issue that arises in fabricating spin valve sensors using conventional techniques is the matching of magnetic flux at the sensor edge. A pre-sputter etch to remove residue will necessarily remove magnetic material from the free layer, thereby reducing the moment of the free layer and creating a mismatch of magnetic flux. The removed material can be replaced by an in situ deposition, but the deposition can never be perfect, especially in the vicinity of a photo mask.

Thus, there is a need for a method of forming a spin valve sensor with exchange tabs, which results in better exchange coupling between the exchange tabs and the free layer of the spin valve.

BRIEF SUMMARY OF THE INVENTION

A spin valve sensor with antiferromagnetic exchange stabilization and method for forming such a sensor are disclosed. The spin valve sensor of the present invention comprises a first layer of ferromagnetic material and a second layer of ferromagnetic material. The second layer of ferromagnetic material has passive end regions separated by a central active region. A first layer of non-ferromagnetic material is positioned between the first and second layers of ferromagnetic material. A pinning layer is positioned adjacent to the first layer of ferromagnetic material such that the pinning layer is in contact with the first layer of ferromagnetic material. The spin valve includes a synthetic antiferromagnetic bias means extending over the passive end regions for producing a longitudinal bias in the passive end regions of a level sufficient to maintain the passive end regions in a single domain state. The synthetic antiferromagnets provide an increased pinning field and reduced side reading.

A preferred method for forming the spin valves of the present invention comprises depositing a first layer of antiferromagnetic material. A first layer of ferromagnetic material is deposited upon the first layer of antiferromagnetic material. A spacer layer is deposited upon the first layer of ferromagnetic material. A second layer of ferromagnetic material is deposited upon the spacer layer. A second antiferromagnetic layer is deposited upon the second layer of ferromagnetic material. A photoresist layer is deposited upon a central region of the second layer of antiferromagnetic material. The photoresist layer defines a central region in each of the second layer of antiferromagnetic material and the second layer of ferromagnetic material. The photoresist layer also at least partially defines first and second outer regions in each of the second layer of antiferromagnetic material and the second layer of ferromagnetic material. Contact material is deposited upon the first and second outer regions of the second layer of antiferromagnetic material. The photoresist layer is removed. Antiferromagnetic material is removed from the central region of the second layer of antiferromagnetic material.

The method of the present invention provides numerous advantages over the use of conventional techniques. A "perfect" interface is obtained between the exchange tab material and the free layer because there is no photo mask present to cause excess residue, shadowing or other complications. The exchange tabs and the electrical contacts are automatically aligned during the process. The milling of the exchange tab material can be stopped before reaching the interface between the exchange tab material and the free layer without removing any portion of the free layer, as long as the remaining thickness is less than the critical pinning thickness of the exchange tab material. The presence of the contacts allows the transfer curve characteristics of the sensor to be monitored during the mill, indicating if the mill time is adequate. Thus, the moment of the free layer is not reduced and there is not a problem with mismatched flux, stray fields or shield saturation. In addition, the process is easy to perform in high volume.

In an alternative embodiment of the method of the present invention, rather than removing antiferromagnetic material from the central region of the second layer of antiferromagnetic material, the central region is exposed to a reactive plasma, which alters the composition of the central region and ruins the exchange coupling.

BRIEF DESCRIPTION OF THE DRAWINGS

FIG. 4 is a perspective view of a prior art GMR spin valve stack with permanent magnet abutted junctions.

DETAILED DESCRIPTION

Figure 1:
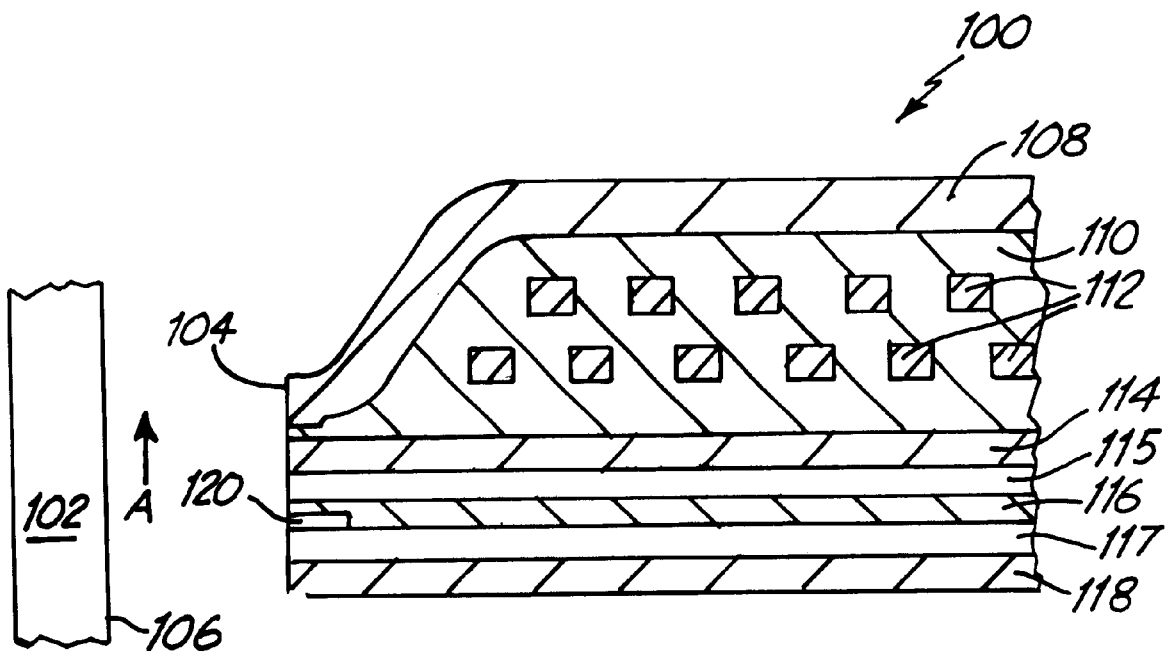
FIG. 1 is a cross-sectional view of a magnetic read/write head and magnetic disc taken along a plane normal to an air bearing surface of the read/write head.

FIG. 1 is a cross-sectional view of magnetic read/write head 100 and magnetic disc 102 taken along a plane normal to air bearing surface 104 of read/write head 100. Air bearing surface 104 of magnetic read/write head 100 faces disc surface 106 of magnetic disc 102. Magnetic disc 102 travels or rotates in a direction relative to magnetic read/write head 100 as indicated by arrow A. Spacing between air bearing surface 104 and disc surface 106 is preferably minimized while avoiding contact between magnetic read/write head 100 and magnetic disc 102.

A writer portion of magnetic read/write head 100 includes top pole 108, insulator layer 110, conductive coils 112 and top shield 114. Conductive coils 112 are held in place between top pole 108 and top shield 114 by use of insulator 110. Conductive coils 112 are shown in FIG. 1 as two layers of coils but may also be formed of more layers of coils as is well known in the field of magnetic read/write head design.

A reader portion of magnetic read/write head 100 includes top shield 114, top gap layer 115, metal contact layer 116, bottom gap layer 117, bottom shield 118, and giant magnetoresistive (GMR) stack 120. Metal contact layer 116 is positioned between top gap layer 115 and bottom gap layer 117. GMR stack 120 is positioned between terminating ends of metal contact layer 116 and bottom gap layer 117. Top gap layer 115 is positioned between top shield 114 and metal contact layer 116. Bottom gap layer 117 is positioned between metal contact layer 116 and bottom shield 118. Top shield 114 functions both as a shield and as a shared pole for use in conjunction with top pole 108.

Figure 2:
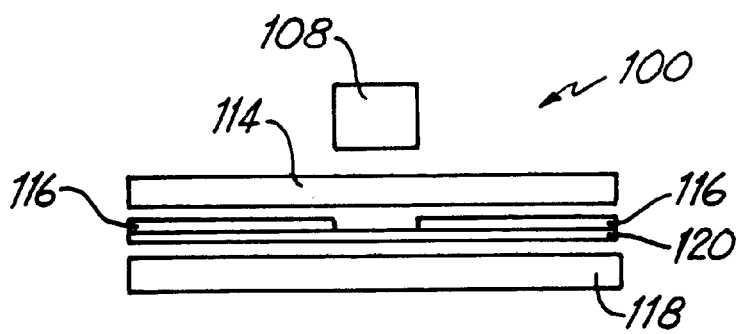
FIG. 2 is a layer diagram of an air bearing surface of a magnetic read/write head.

FIG. 2 is a layer diagram of air bearing surface 104 of magnetic read/write head 100. FIG. 2 illustrates the location of magnetically significant elements in magnetic read/write head 100 as they appear along air bearing surface 104 of magnetic read/write head 100 of FIG. 1. In FIG. 2, all spacing and insulating layers of magnetic read/write head 100 are omitted for clarity. Bottom shield 118 and top shield 114 are spaced to provide for a location of GMR stack 120. GMR stack 120 has two passive regions defined as the portions of GMR stack 120 adjacent to metal contact layer 116. An active region of GMR stack 120 is defined as the portion of GMR stack 120 located between the two passive regions of GMR stack 120. The active region of GMR stack 120 defines a read sensor width.

Figure 3:
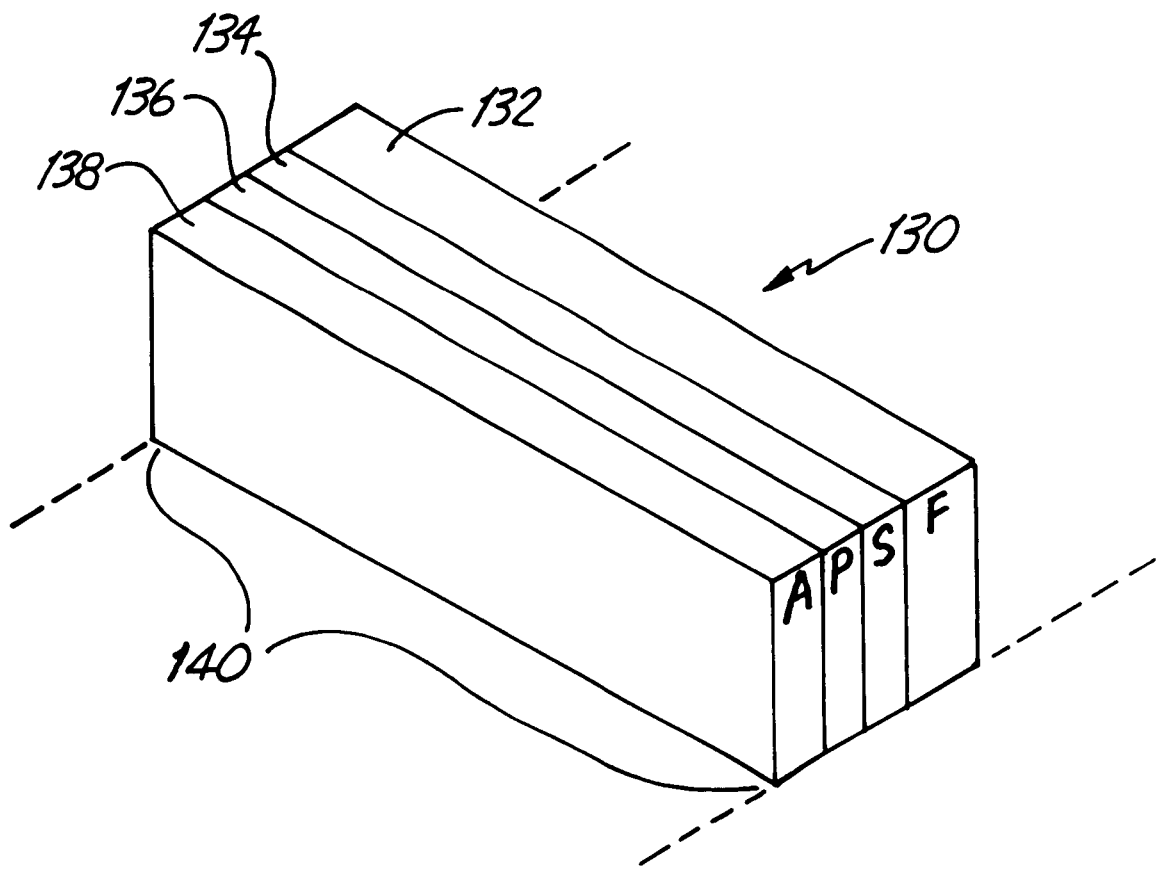
FIG. 3 is a perspective view of a prior art GMR stack.

FIG. 3 is a perspective view of a prior art GMR stack 130. GMR stack 130 has free layer 132, spacer layer 134, pinned layer 136, and antiferromagnetic layer 138. Spacer layer 134 is positioned between free layer 132 and pinned layer 136. A magnetization of pinned layer 136 is fixed in a predetermined direction, generally normal to air bearing surface 140 of GMR stack 130, while a magnetization of free layer 132 rotates freely in response to an external magnetic field (not shown in FIG. 3). Antiferromagnetic layer 138 is positioned on GMR stack 130 such that pinned layer 136 is between spacer layer 134 and antiferromagnetic layer 138. The magnetization of pinned layer 136 is pinned by exchange coupling pinned layer 136 with antiferromagnetic layer 138.

The resistance of GMR stack 130 varies as a function of an angle that is formed between the magnetization of pinned layer 136 and the magnetization of free layer 132. The magnetization of pinned layer 136 remains fixed in one direction, while the magnetization of free layer 132 rotates in response to a magnetic field emanating from a magnetic media or disc. The angle formed between the magnetization of free layer 132 and the magnetization of pinned layer 136 is, therefore, directly related to the magnetic field emanating from a magnetic media or disc. Consequently, the resistance of GMR stack 130 is directly related to the magnetic field emanating from the magnetic media or disc.

Prior to describing the exchange tabs of the present invention, a specific embodiment of a prior art method of sensor stabilization is described with reference to FIG. 4. FIG. 4 is a perspective view of prior art GMR spin valve stack 150 with permanent magnet abutted junctions. GMR stack 150 includes permanent magnets 154A and 154B, pinning layer 156, pinned layer 158, spacer layer 160 and free layer 162. Pinned layer 158 is positioned over pinning layer 156. Spacer layer 160 is positioned over pinned layer 158. Free layer 162 is positioned over spacer layer 160. Permanent magnets 154A and 154B are placed on each side of GMR stack 150. Junction 152A is located between permanent magnet 154A and a first edge of layers 156–162. Junction 152B is positioned between permanent magnet 154B and a second edge of layers 156–162.

The field from permanent magnets 154A and 154B stabilizes free layer 162 and prevents edge domain formation, and provides proper bias. However, there are several:problems with the permanent magnet abutted junction design shown in FIG. 4. To properly stabilize free layer 162, permanent magnets 154A and 154B must provide more flux than can be closed by free layer 162. This undesirable extra flux stiffens the edges of free layer 162 and may also cause shield saturation. The junctions 152A and 152B must be carefully engineered to minimize this stray flux as well as to minimize the junction resistance. Also, a junction of dissimilar metals can cause unwanted strain in the sensor. Free layer 162 will respond to the strain unless the magnetostriction is exactly zeroed. Another disadvantage of permanent magnetic abutted junctions is the nature of hard magnetic materials, which are multi-domained. Variation in grain size and shape leads to a distribution of domain coercivity. Lower coercivity domains may rotate when subjected to external fields. Such a grain near the edge of free layer 162 could cause domain wall formation and failure. The extra flux from permanent magnets 154 may produce multiple domains in free layer 162 and may also produce dead regions which reduce the sensitivity of the sensor.

Figure 5A:
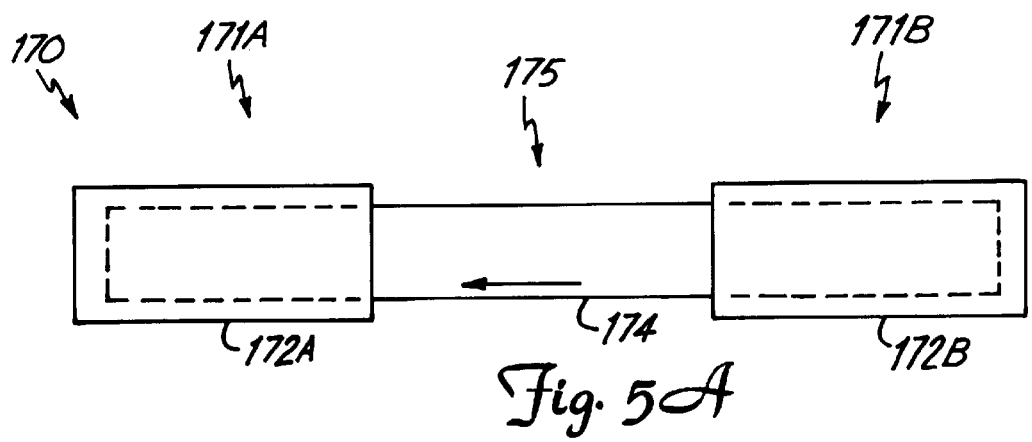
FIG. 5A shows a top view of a GMR spin valve stack with exchange tabs.

FIG. 5A shows a top view of GMR spin valve stack 170. GMR stack 170 includes free layer 174 and exchange tabs 172A and 172B (collectively referred to as exchange tabs 172). Exchange tabs 172 are placed at the end regions 171A and 171B of free layer 174. As can be seen in FIG. 5A, free layer 174 extends under exchange tabs 172 as represented by the hidden lines. Exchange tabs 172 are antiferromagnetic pinning layers, which are exchange coupled to end regions 171 of free layer 174 and which pin end regions 171 of free layer 174 in the proper direction, which is represented by the arrow on free layer 174. Exchange tabs 172 also prevent the formation of edge domains in free layer 174, and define the width of an active area 175 of free layer 174 by preventing free layer rotation in end regions 171.

Figure 5B:
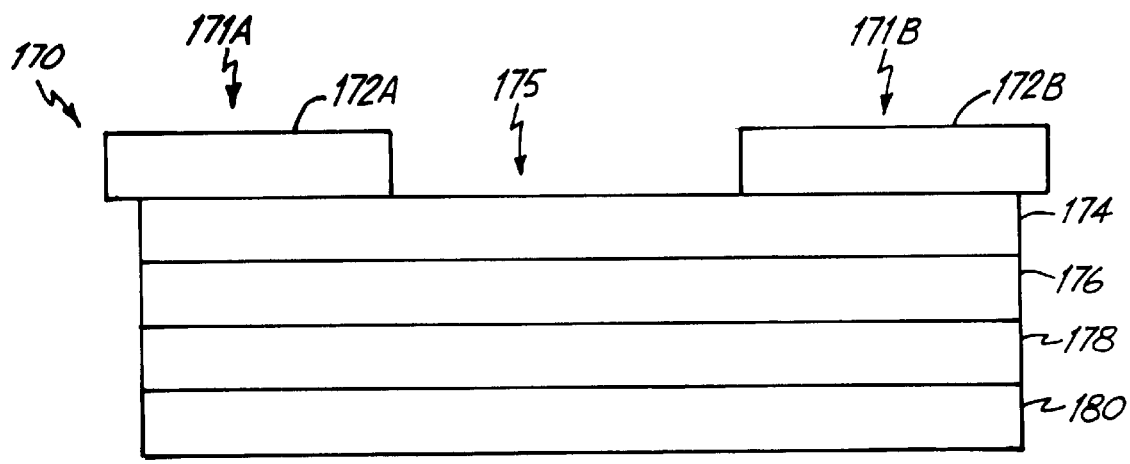
FIG. 5B shows a side view of a GMR spin valve stack with exchange tabs and with the free layer oriented upwards.

FIG. 5B shows a side view of GMR spin valve stack 170. GMR stack 170 includes exchange tabs 172, free layer 174, spacer layer 176, pinned layer 178 and pinning layer 180. Pinned layer 178 is positioned over pinning layer 180. Spacer layer 176 is positioned over pinned layer 178. Free layer 174 is positioned over spacer layer 176. Exchange tabs 172 are positioned over free layer 174 at each end of free layer 174.

Figure 5C:
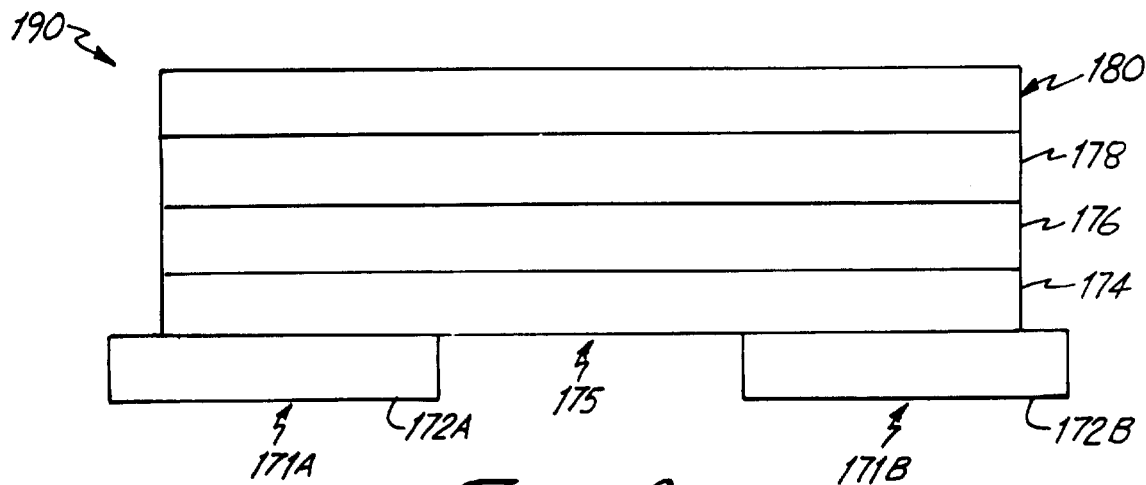
FIG. 5C shows a side view of a GMR spin valve stack with exchange tabs and with the free layer oriented downwards.

FIG. 5C shows a side view of GMR spin valve stack 190, which is the same as GMR stack 170 shown in FIG. 5B, but is oriented in an opposite direction. Exchange tabs 172 can be used in either configuration of a GMR stack.

Exchange tabs 172 are preferably made from an antiferromagnetic material having a high coupling constant and a high blocking temperature, such as NiMn, PtMn or IrMn. PtMn exhibits good corrosion resistance and low coercivity. IrMn also has a low coercivity. The following table provides coupling constants, blocking temperatures and other characteristics of various antiferromagnetic materials:

| Materials | MnFe | NiMn | IrMn | PtPdMn | NiO | PtMn | CrMn |
|---|---|---|---|---|---|---|---|
| Blocking temp. | 150° C. | 380° C. | 240° C. | 300° C. | 190° C. | 370° C. | 320° C. |
| Coupling Constant (Erg/cm²) | 0.1 | ~0.3 | 0.2 | 0.12 | 0.09 | 0.2 | 0.2 |
| Bulk Resistivity (micro-Ohms cm) | 150 | 200 | 200 | 150 | insulator | 170 | 300 |
| Annealing Requirement | No | 270° C. | No | 250° C. | No | 270° C. | 230° C. |

Exchange tabs 172 increase the effective Hk of end regions 171 of free layer 174, thereby reducing the permeability of the end regions 171. The effective Hk of the end regions 171 of free layer 174 is the sum of $H_p$ (pinning field) and $H_c$ (coercivity). Materials with high coupling constants are desirable for exchange tabs 172 because these materials provide for a greater increase in the effective Hk of end regions 171 and therefore provide for a greater reduction in the side reading. A high blocking temperature is desirable because the pinned regions of the free layer may become unpinned if the temperature of the sensor is raised above the blocking temperature of the exchange tabs during operation.

Figure 6A:
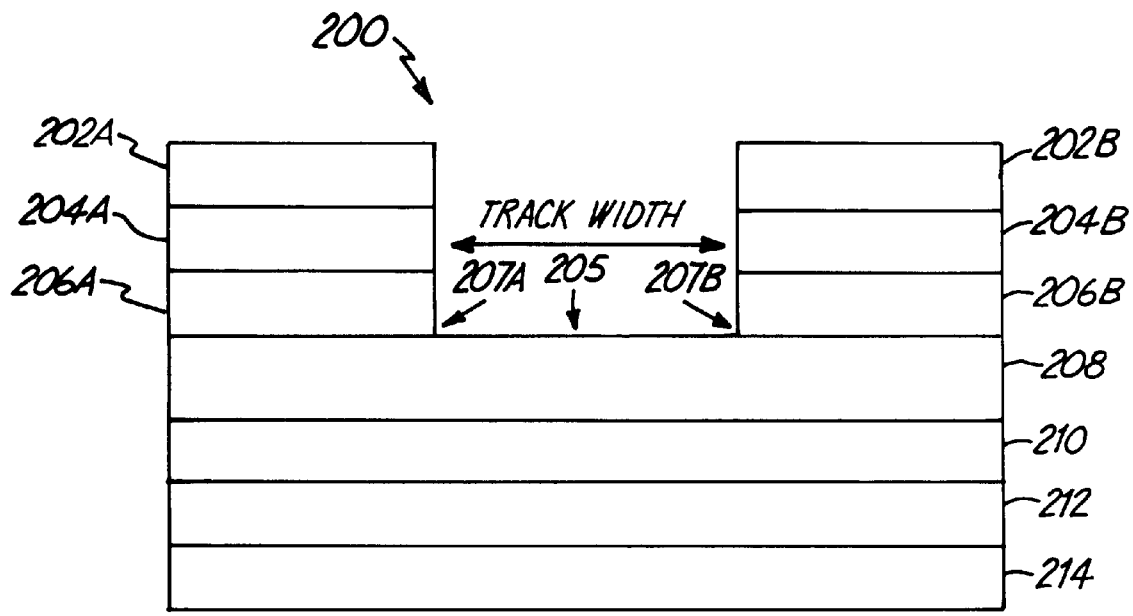
FIG. 6A shows a side view a of GMR spin valve stack with exchange tabs comprising synthetic antiferromagnets.

FIG. 6A shows a side view of GMR spin valve stack 200. GMR stack 200 includes antiferromagnetic layers 202A and 202B, CoFe layers 204A and 204B, Ru layers 206A and 206B, free layer 208, spacer layer 210, pinned layer 212 and pinning layer 214. The combination of antiferromagnetic layer 202A, CoFe layer 204A, Ru layer 206A and the portion of free layer 208 located under Ru layer 206A (i.e., end region 207A) is referred to as a synthetic antiferromagnet (SAF). Similarly, on the other side of free layer 208, the combination of antiferromagnetic layer 202B, CoFe layer 204B, Ru layer 206B and the portion of free layer 208 located under Ru layer 206B (i.e., end region 207B) is also referred to as a SAF. When two ferromagnetic layers, such as CoFe layers 204 and free layer 208 are separated by an Ru spacer of an appropriate thickness, the two ferromagnetic layers couple strongly with magnetic moments anti-parallel as shown by the arrows on these layers in FIG. 6A. The coupling between CoFe layers 204 and free layer 208 results in a very large effective Hk in the end regions 207 of free layer 208. If a SAF is set along the air bearing surface direction of a sensor, an applied field perpendicular to the air bearing surface direction cannot easily rotate the two ferromagnetic layers 204 and 208. Therefore, the stiffness of free layer 208 in the end regions 207 is greatly enhanced (by up to a factor of 10). In a preferred embodiment, CoFe layers 204 are about 20 angstroms thick, Ru spacer layers 206 are about 10 angstroms thick, and free layer 208 is about 30 angstroms thick. For these preferred dimensions, a field of 5000 Oe is needed to rotate the pinned regions 207. Pinned layer 212 may also be a SAF structure to provide enhanced stiffness.

Figure 6B:
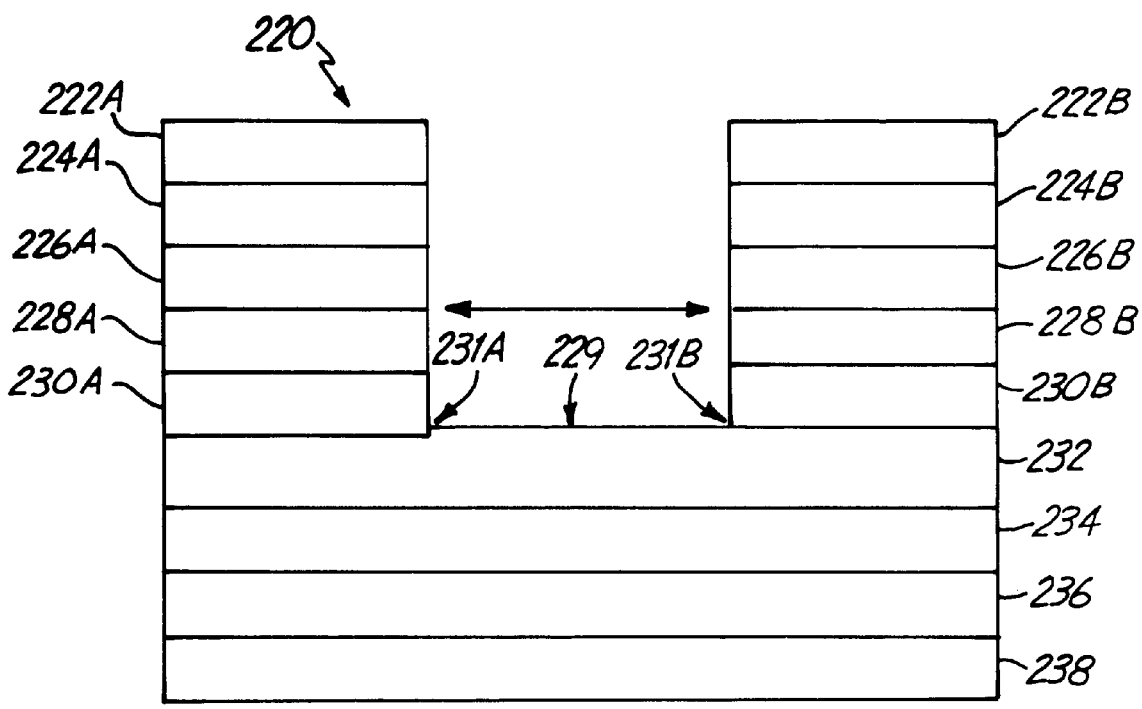
FIG. 6B shows a side view of a GMR spin valve stack with exchange tabs comprising synthetic antiferromagnets with additional ferromagnetic layers.

FIG. 6B shows a side view of GMR spin valve stack 220. GMR stack 220 includes antiferromagnetic layers 222A and 222B, CoFe layers 224A and 224B, Ru layers 226A and 226B, CoFe layers 228A and 228B, Ru layers 230A and 230B, free layer 232, spacer layer 234, pinned layer 236 and pinning layer 238. GMR stack 220 is the same as GMR stack 200 shown in FIG. 6A, but includes additional CoFe layers 224 and Ru layers 226. The addition of CoFe layers 224 and Ru layers 226 balances extra flux along the air bearing surface and thereby eliminates the stray field from unbalanced exchange tabs like those shown in FIG. 6A. The extra flux is caused by the generation of poles in CoFe layers 204. Pinned layer 236 may also be a SAF structure to provide enhanced stiffness. The magnetizations of various layers are shown by arrows in FIG. 6B.

Figure 7A:
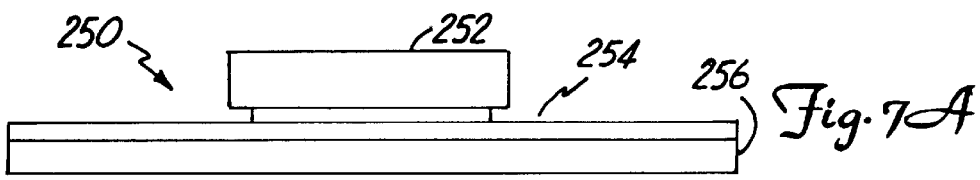
FIGS. 7A–7D illustrate a conventional patterning method which can be used to fabricate a sensor with exchange tabs.
Figure 7B:
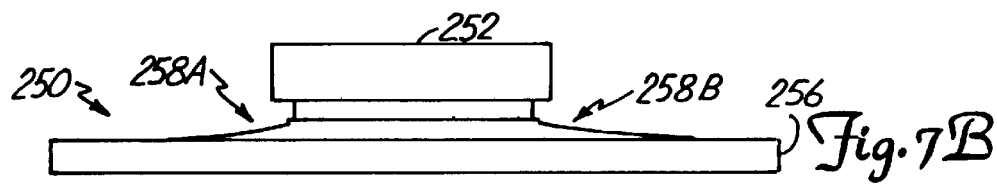
Figure 7C:
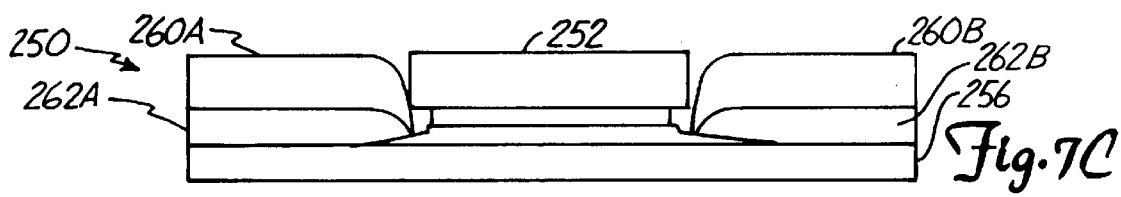

Prior to describing a preferred method for fabricating spin valve sensors with exchange tabs in accordance with the present invention, conventional fabrication techniques will be discussed with reference to FIGS. 7A–7D. FIGS. 7A–7D illustrate a conventional patterning method which can be used to fabricate a sensor 250 with exchange tabs. A major difficulty in manufacturing sensors with exchange tabs using conventional methods is establishing adequate exchange coupling between the exchange tabs and the free layer. As shown in FIG. 7A, a photoresist lift-off mask 252 is typically present during deposition of the exchange tab material on free layer 256. Unless a cap layer is used, producing the lift-off mask 252 necessarily involves exposing free layer 256 to atmosphere, photoresist and developer. At a minimum, a layer of oxide forms on free layer 256. For this reason, a cap layer is frequently used to prevent oxidation or other chemical reactions. In the discussion that follows, layer 254 is referred to as a "residue"layer, and represents any material such as oxide or a cap layer that would adversely affect the necessary exchange coupling. Whether a cap layer is used or not, it is necessary to employ some removal process such as a pre-sputter etch or reactive ion etch on residue layer 254 to expose a clean, unoxidized surface of free layer 256 to establish exchange coupling with deposited exchange tab material. A single monolayer of non-magnetic material is sufficient to destroy the exchange coupling. The removal step is problematic because of the presence of photo mask 252.

Figure 7D:
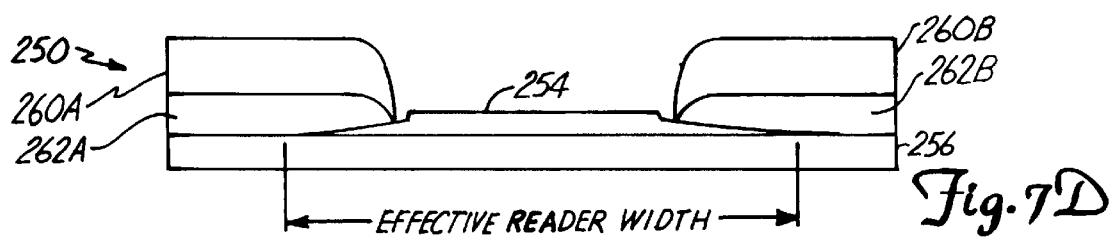

An in situ pre-sputter etch is typically performed to remove residue layer 254, but the presence of photo mask 252 makes it extremely difficult to remove residue close to photo mask 252. (See FIG. 7B). The excess residue 258A and 258B near photo mask 252 prevents proper exchange coupling between exchange tab material 262A and 262B (which is deposited on top of free layer 256) and free layer 256. (See FIG. 7C). Without this exchange coupling, the portions of free layer 256 under excess residue 258A and 258B rotate in response to field from the media, producing an off-track signal. FIG. 7D illustrates the effective width of the sensor in the presence of a feathered tail of excess residue 258. A final step in the conventional method is to deposit contact material 260A and 260B over exchange tab material 262.

Photo mask 252 causes another problem during the deposition of the exchange tab material 262. Near the edge of the photo mask 252, some amount of shadowing is inevitable, causing reduced thickness of exchange tab material 262 near photo mask 252. Thus, even if it were possible using conventional techniques to completely remove the residue 254 near photo mask 252, the reduced thickness of the exchange tab material 262 near photo mask 252 would still cause a problem. Since the pinning strength of exchange tabs 262 is strongly dependent on thickness, it is necessary to compensate for the reduced thickness near the photo mask 252 by increasing the overall layer thickness to provide a margin of safety. As the size of recording heads shrink, thinner layers become more attractive. Collimated deposition techniques can be employed to avoid thinning, but such an approach adds an extra constraint to the deposition process. It would be preferable to optimize for material quality with no geometry constraints.

Another issue that arises with conventional techniques is the matching of magnetic flux at the sensor edge. A pre-sputter etch to remove residue 254 will necessarily remove magnetic material from free layer 256, thereby reducing the moment of free layer 256 and creating a mismatch of magnetic flux. This material can be replaced by an in situ deposition, but the deposition can never be perfect, especially in the vicinity of photo mask 252.

Figure 8A:
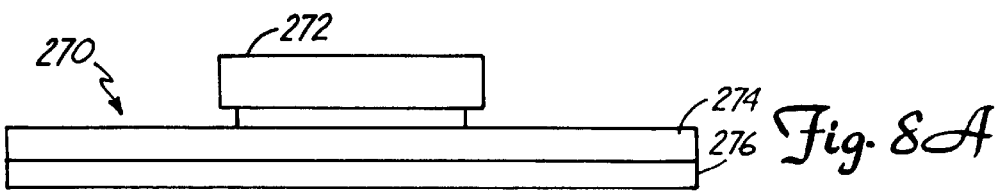
FIGS. 8A–8D illustrate a preferred method for fabricating a GMR spin valve stack with exchange tabs.
Figure 8B:
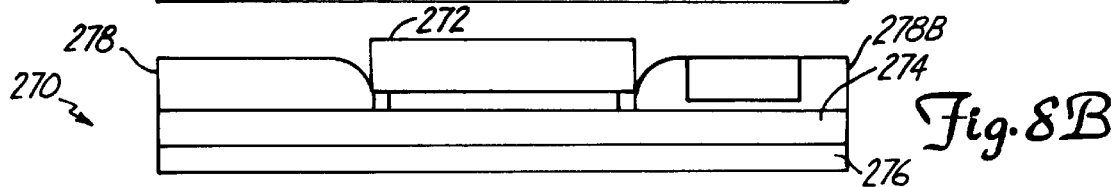
Figure 8C:
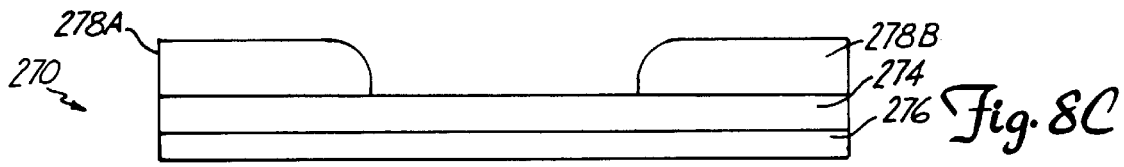
Figure 8D:
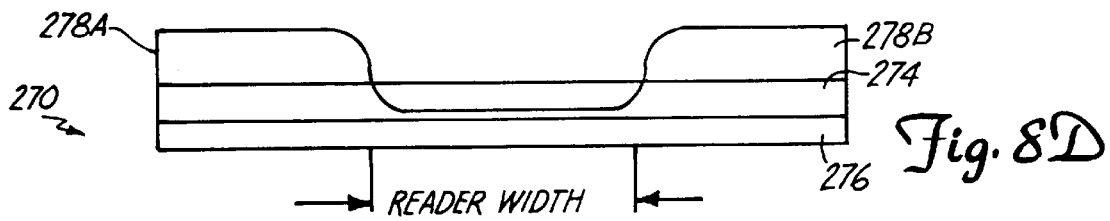

The method illustrated in FIGS. 8A–8D alleviates the problems associated with the previously described conventional techniques. FIG. 8A shows photo mask 272, exchange tab layer 274 and free layer 276. Rather than starting with a photo mask 272, the exchange tab layer 274 is deposited on free layer 276 before patterning. (See FIG. 7A). Since the deposition takes place in a vacuum, free layer 276 is not exposed to air prior to the addition of exchange tab layer 274. This ensures that the interface between free layer 276 and exchange tab layer 274 is clean and uncomplicated by the presence of features. At this stage of the process, the free layer 276 is not free, but pinned. Photo mask 272 is deposited on a central region of exchange tab layer 274. Electrical contacts 278A and 278B are then deposited using conventional procedures (See FIG. 8B). Photo mask 272 is removed. (See FIG. 8C). The final step is a mill of exchange tab material 274 between contacts 278. (See FIG. 8D). The electrical contacts 278A and 278B act as a mask during the milling step. Once the exchange tab material 274 between contacts 278 is removed, the portion of free layer 276 between contacts 278 is once again free to rotate. The portions of free layer 276 located under contacts 278 remain pinned. The active area or reader width is shown in FIG. 8D. As can be seen in FIG. 8D, there is no widening of the reader width caused by excess residue. To highlight novel aspects of the present method, FIGS. 8A–8D only show the top few layers of spin valve 270. A spacer layer, pinned layer and pinning layer are also part of spin valve 270, and are deposited using conventional techniques.

It will be recognized by those of ordinary skill in the art that the method described above with respect to FIGS. 8A–8D may also be used to fabricate spin valve sensors having exchange tabs comprising synthetic antiferromagnets. For such sensors, rather than being a single layer of antiferromagnetic material, exchange tab layer 274 represents a multi-layer stack comprising an antiferromagnetic layer, one or more CoFe layers and one or more Ru layers.

Figure 9A:
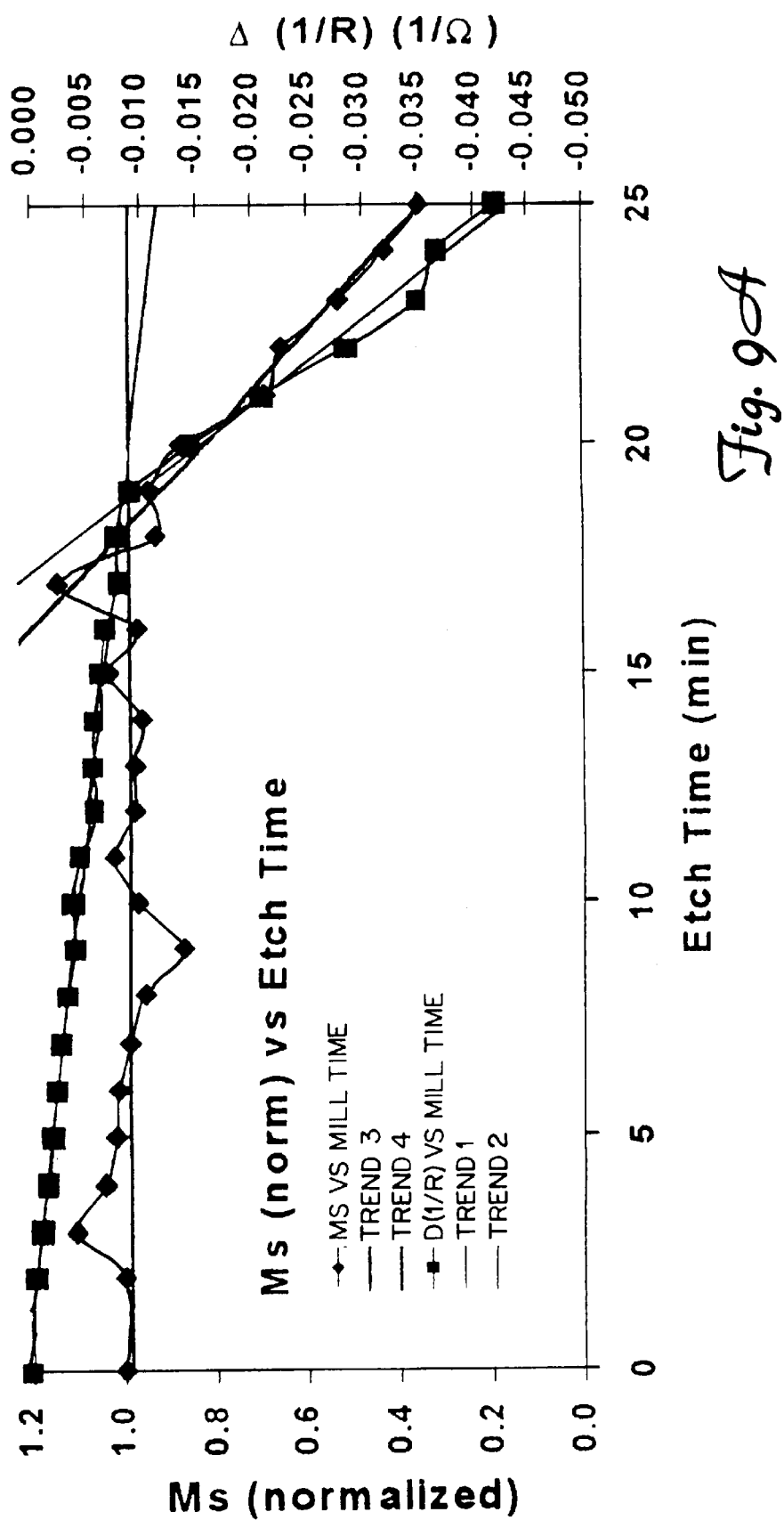
FIGS. 9A–9C show graphs of various sensor characteristics versus time during milling of a GMR stack using the preferred method.
Figure 9B:
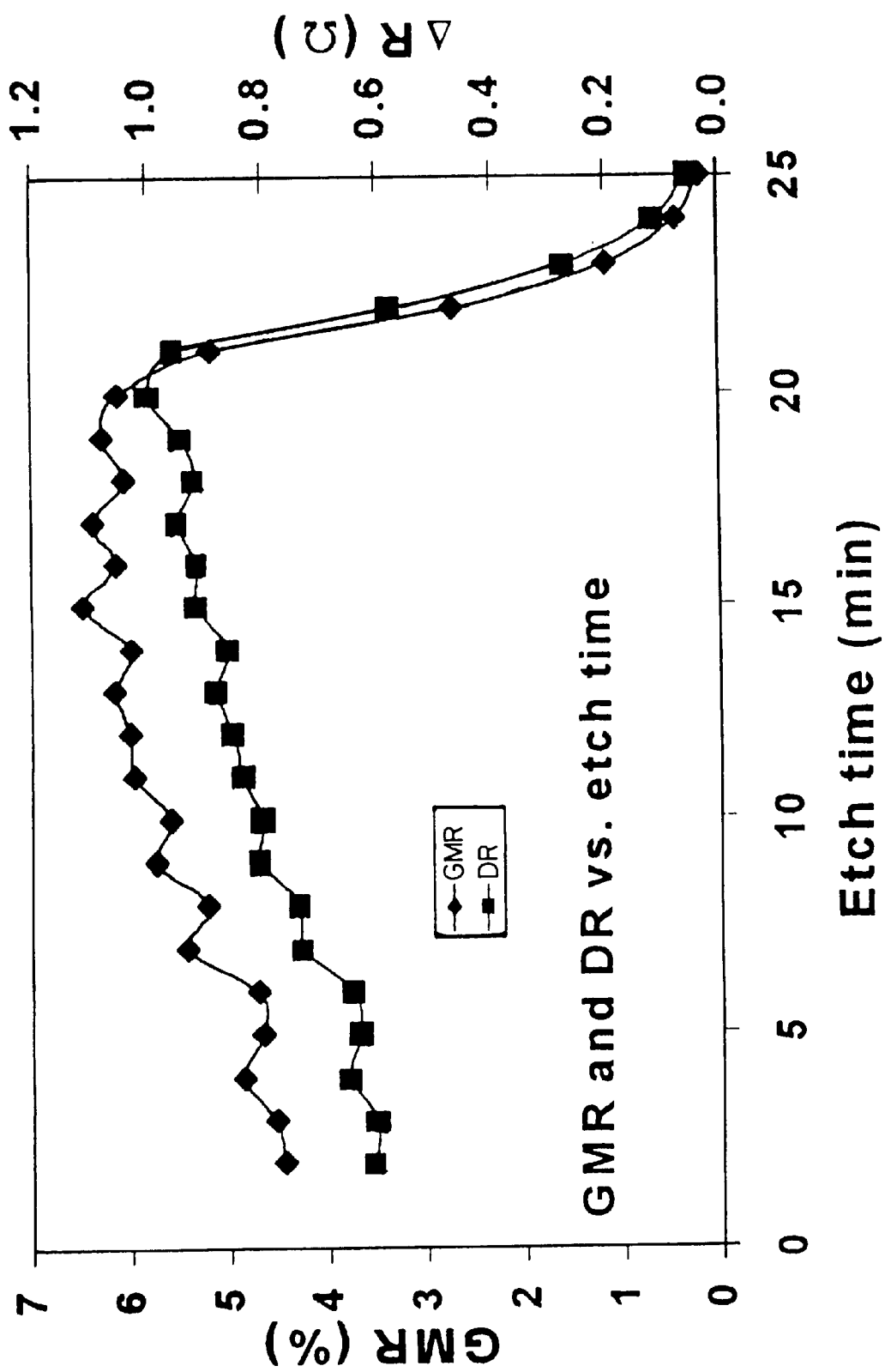
Figure 9C:
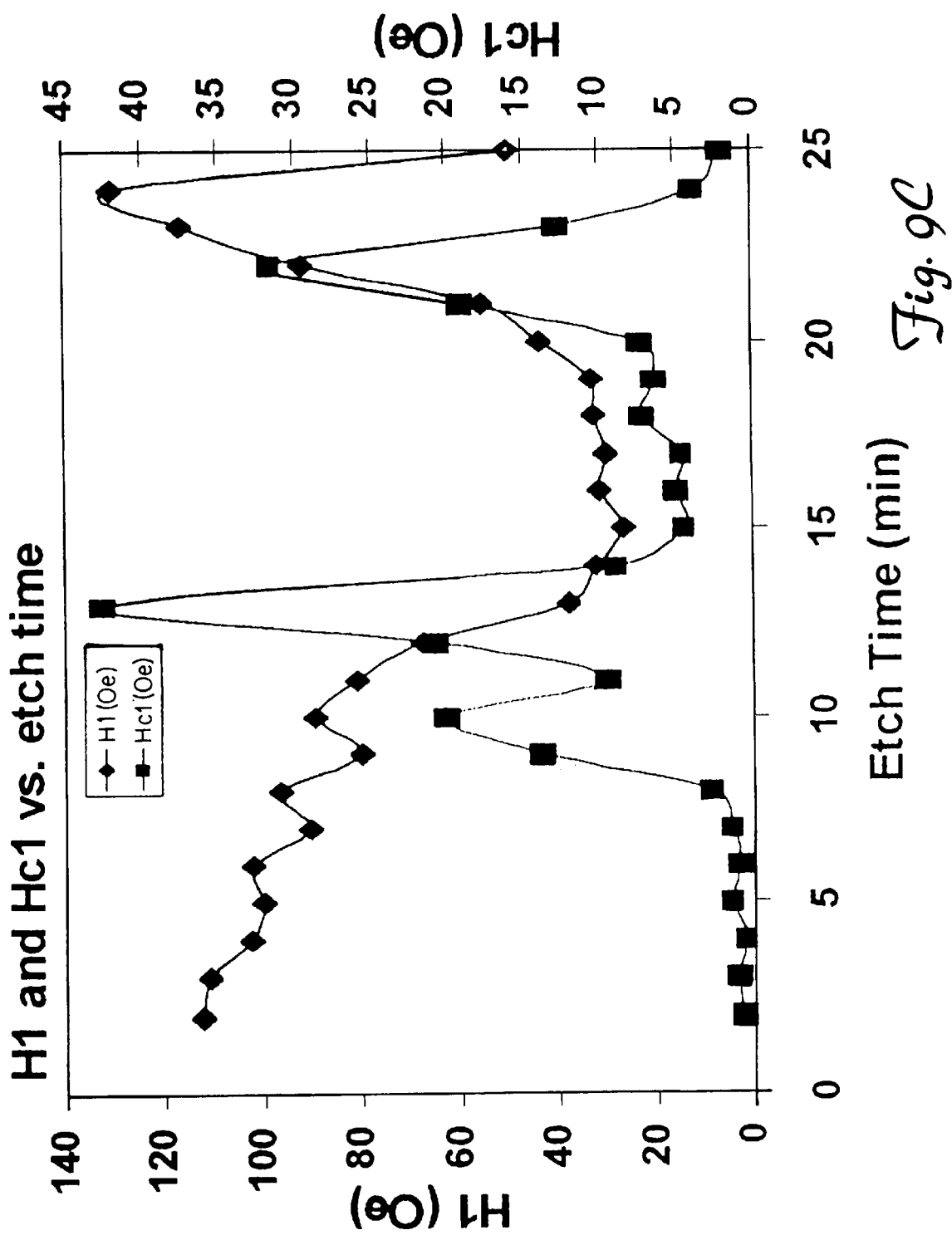

FIGS. 9A–9C show graphs of various sensor characteristics versus time as the mill step (discussed above with respect to FIG. 8D) progresses. FIG. 9A shows $M_s$ (left vertical axis) of free layer 276 in normalized units and $\Delta S$ (right vertical axis) versus time. $M_s$ represents the moment of free layer 276 and $\Delta S$ represents change in conductance. $M_s$ is proportional to the thickness of free layer 276. The graph shows that $M_s$ is constant until approximately 18 minutes into the etch, where it begins to drop linearly. Where $M_s$ is constant, the exchange tab material 274 is being etched away. At 18 minutes, the exchange tab material 274 has been completely removed and free layer 276 is being etched. This is consistent with the $\Delta S$ data, which also shows a sharp drop around 18 minutes. The slope of the $\Delta S$ versus time curve is expected to equal $r\sigma$, where r is the mill rate, and $\sigma$ is the conductivity. A change in slope indicates a change in material.

FIG. 9B shows the GMR ratio (left vertical axis) and ΔR (right vertical axis) versus etch time. The GMR ratio represents the fractional change in resistance when free layer 276 is rotated, and ΔR represents the absolute change in resistance when free layer 276 is rotated. Both characteristics rise steadily as the exchange tab material 274 is milled away and exhibit a plateau before free layer 276 is reached, at which point the characteristics begin to drop precipitously.

FIG. 9C shows $H_1$ (left vertical axis) and $H_{c1}$ (right vertical axis) versus etch time. $H_1$ represents the strength of the coupling between exchange tab material 274 and free layer 276. $H_{c1}$ represents the coercivity of free layer 276. The values of GMR, ΔR, $H_1$ and $H_{1\ c1}$ from a sensor fabricated using the method illustrated in FIGS. 8A–8D are all indistinguishable from the values of an as-grown spin valve sensor. There is little or no degradation in the GMR characteristics due to the milling step of the preferred method.

The method illustrated in FIGS. 8A–8D provides numerous advantages over the use of conventional methods. A "perfect" interface is obtained between exchange tab material 274 and free layer 276 because there is no photo mask 272 present to cause excess residue, shadowing or other complications. The exchange tabs and the electrical contacts 278A and 278B are automatically aligned during the process. The milling of exchange tab material 274 can be stopped before removing any portion of the free layer 276, because the presence of contacts 278 allows the transfer curve characteristics of the sensor to be monitored during the mill. Examination of the transfer curve would show if the mill time were too short. A wafer could be milled for an additional period until the desired results are obtained. Thus, the moment of free layer 276 is not reduced and there is not a problem with mis-matched flux, stray fields or shield saturation. In addition, the process is easy to perform in high volume.

In an alternative preferred method for forming a spin valve sensor with exchange tabs, rather than freeing free layer 276 by milling the exchange tab material 274 between contacts 278A and 278B as described above and shown in FIG. 8D, the exchange tab material 274 between contacts 278A and 278B is exposed to a reactive plasma that reacts with at least some of the materials in the exchange tab material 274. In a preferred embodiment, exchange tab material 274 is exposed to oxygen, $CF_4$, $CHF_3$ or similar gas. Contacts 278 act as a mask during the process. The process is referred to as a two step reactive ion etch (RIE), wherein the first step is removal of a tantalum capping layer that is typically present over the exchange tab material 274, and the second step is exposure to the reactive plasma. Even though the process is referred to as an "etch", in a preferred embodiment, the exchange tab material 274 is actually left in place after exposure to the reactive plasma, and is not etched away. The reaction changes the chemical composition of the exchange tab material 274 in the region between contacts 278, and results in a new material, which will be referred to as "AFM*". The reaction ruins the exchange coupling between free layer 276 and exchange tab material 274 in the region between contacts 278, and thereby frees free layer 276 in this region.

Figure 10:
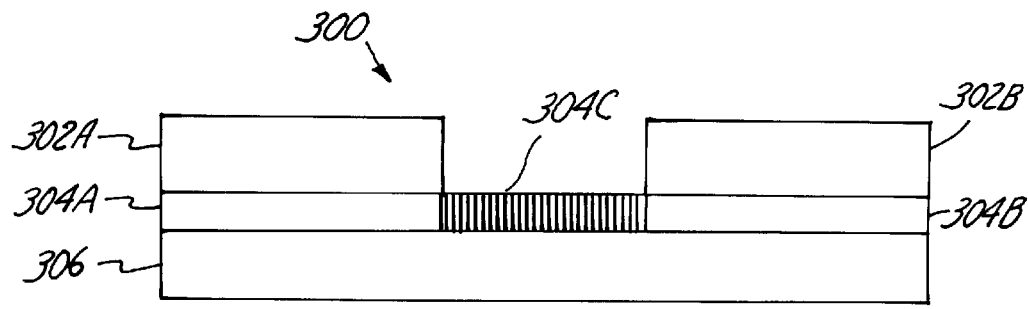
FIG. 10 shows a side view of a spin valve stack with exchange tabs formed by an alternative preferred method.

FIG. 10 shows a side view of spin valve 300, which is formed by the alternative preferred method. Spin valve 300 includes contacts 302A and 302B exchange tabs 304A and 304B, AFM* material 304C and GMR stack 306. As with the GMR stacks discussed above, GMR stack 306 includes a pinned layer, a pinning layer, a spacer layer and a free layer. The free layer of GMR stack 306 is positioned at the top of GMR stack 306, and is adjacent to AFM* material 304C and exchange tabs 304A and 304B. As can be seen in FIG. 10, AFM* material 304C remains after processing is complete. After the reactive ion etch, the exchange coupling between AFM* material 304C and the portion of the free layer located under AFM* material 304C is destroyed, while exchange tabs 304A and 304B remain exchange coupled to the free layer.

The alternative preferred method provides additional advantages over the method illustrated in FIGS. 8A–8D. The additional advantages will be discussed with respect to the graphs shown in FIGS. 11–13.

Figure 11A:
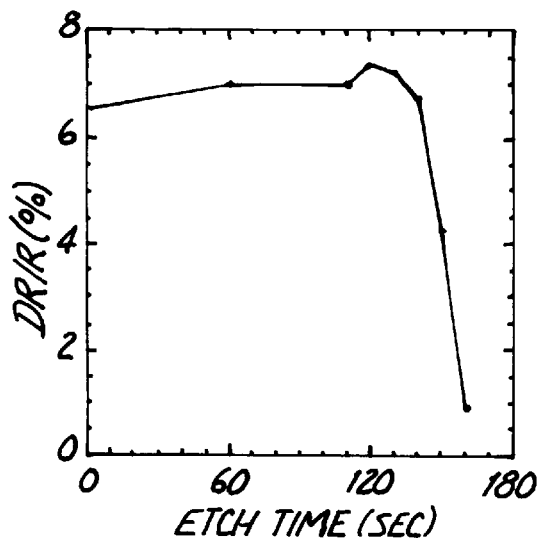
FIG. 11A shows a second graph of GMR versus etch time for the method illustrated in FIGS. 8A–8D.

FIG. 11A shows a graph of GMR versus etch time for the method illustrated in FIGS. 8A–8D. GMR remains essentially constant until approximately 120 seconds into the etch. At about 120 seconds, exchange tab material 274 has been milled away and free layer 276 is attacked. As free layer 276 is milled, GMR decreases sharply.

Figure 11B:
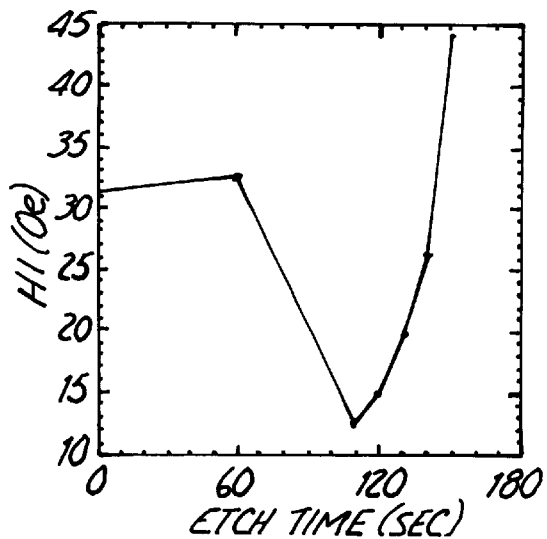
FIG. 11B shows a graph of coupling strength versus etch time for the method illustrated in FIGS. 8A–8D.

FIG. 11B shows a graph of the strength of coupling between free layer 276 and pinned layer 178 (which is represented by H1) versus etch time in seconds for the method illustrated in FIGS. 8A–8D. As shown in FIG. 11B, the coupling strength starts out fairly constant and then decreases as exchange tab material 274 is milled. At approximately 120 seconds into the etch, free layer 276 is attacked and the coupling strength sharply increases.

Figure 12A:
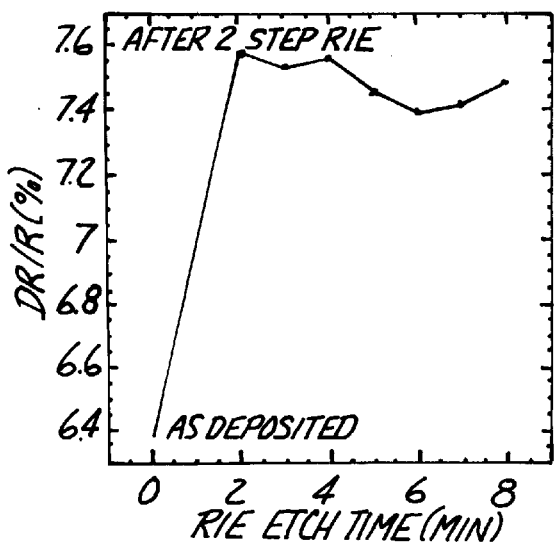
FIG. 12A shows a graph of GMR versus etch time for an alternative preferred method.

FIG. 12A shows a graph of GMR versus etch time for the alternative preferred method. As shown in FIG. 12A, the GMR rises during the first couple of minutes of the etch, and then levels off and remains substantially constant. The GMR does not decrease even after an extended exposure to the reactive plasma.

Figure 12B:
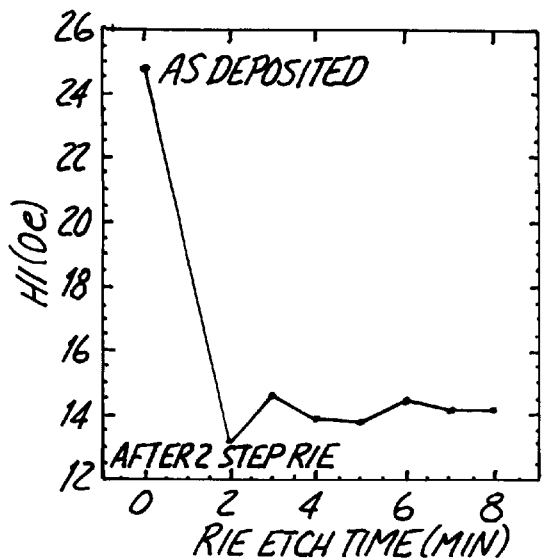
FIG. 12B shows a graph of coupling strength versus etch time for an alternative preferred method.

FIG. 12B shows a graph of the coupling strength between free layer 276 and pinned layer 178 versus etch time for the alternative preferred method. The coupling strength decreases during the first couple of minutes into the process, and then remains substantially constant. The coupling strength does not increase even after extended exposure to the reactive plasma.

In comparing FIG. 11A with FIG. 12A and FIG. 11B with FIG. 12B, it is evident that the alternative preferred method has a greater process latitude than the method illustrated in FIGS. 8A–8D. For the method illustrated in FIGS. 8A–8D, if the exchange tab material 274 is milled too long, free layer 276 will be attacked, resulting in a decrease in the GMR effect (see FIG. 11A) and an increase in the coupling between free layer 276 and pinned layer 178 (see FIG. 11B). The increased coupling between free layer 276 and pinned layer 178 is undesirable because it results in poor symmetry in the final device. The magnetization of free layer 276 should be perpendicular to pinned layer 178, but as the coupling between the two layers gets stronger, the magnetization of free layer 276 will tend to move parallel to pinned layer 178.

There is approximately a 20–30 second ion mill time window for a given wafer using the method illustrated in FIGS. 8A–8D. For example, assuming that the coupling strength $H_1$ must be less than about 18 Oe, the milling of exchange tab material 274 must stop within about 10–15 seconds before or after the time at which the minimum coupling strength occurs (See FIG. 11B). If the exchange tab material 274 is not milled long enough, there will be hysteresis in the R versus H loop, which will show up as noise in the final device. In addition, the excess exchange tab material 274 may result in shunting. If there is any mill rate variation or wafer-to-wafer variation in the thickness or uniformity of exchange tab material 274, the process could end up outside of the 20–30 second window and all devices could be ruined.

The alternative preferred method provides a larger process latitude by allowing the use of long process times to ensure that the exchange coupling between free layer 276 and exchange tab material 274 is destroyed on all of the devices without harming the free layer on any of the devices. The alternative preferred method ensures that all devices are processed sufficiently and none are processed too long. The alternative preferred method is not as sensitive to wafer-to-wafer thickness variations and poor uniformity as the method illustrated in FIGS. 8A–8D. Furthermore, the alternative preferred method does not use ion milling, which may cause ESD or EOS failures.

Figure 13:
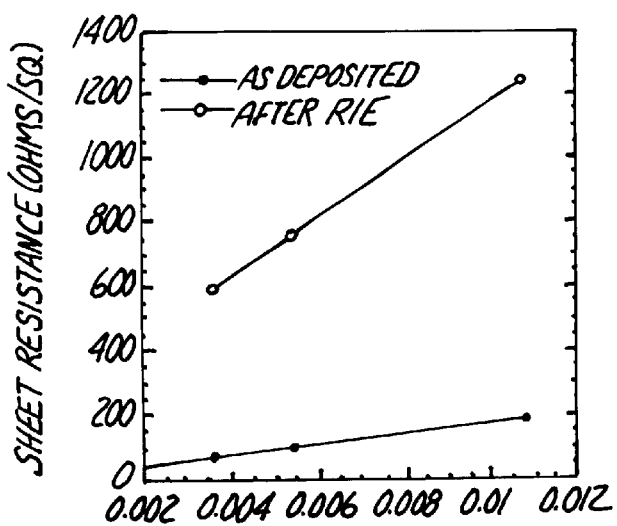
FIG. 13 shows a graph of sheet resistance versus thickness for an antiferromagnetic exchange tab layer before and after processing using an alternative preferred method.

FIG. 13 shows a graph of sheet resistance of AFM* material 304C versus thickness before and after the reactive ion etch. For the graph, IrMn was used for AFM* material 304C. As shown in FIG. 13, AFM* material 304C has a very high resistivity after the reactive ion etch. The high resistivity ensures that AFM* material 304C will not shunt any of the read back current away from the spin valve sensor. The high resistivity also contributes to an increase in GMR of spin valve sensors. After the reactive ion etch, the remaining high resistivity AFM* material 304C may also help prevent reader-to-shield shorting. The GMR stack cannot contact a shield or the device will be ruined. Because of the high resistivity of the AFM* layer 304C, AFM* layer 304C may act as an insulator between the shield and the GMR stack and prevent shorting.

Patterned devices have been formed on top of AFM* layer 304C and then exposed to various processing conditions such as photoresist stripping, plasma etches, and spin rinse dryers, and no delamination of the films was observed. The AFM* material 304C, therefore, appears to be chemically stable and should not corrode in later steps of processing.

Although the present invention has been described with reference to preferred embodiments, workers skilled in the art will recognize that changes may be made in form and detail without departing from the spirit and scope of the invention.

What is claimed is:

1. A spin valve sensor comprising:
   a spin valve stack having first and second passive end regions separated by a central active region; and
   synthetic antiferromagnetic bias means comprising a first multi-layer stack extending on a top surface of the first passive end region to form a first synthetic antiferromagnet, and a second multi-layer stack extending on a top surface of the second passive end region to form a second synthetic antiferromagnet, the synthetic antiferromagnets producing a longitudinal bias in the passive end regions of a level sufficient to maintain the end regions in a single domain state.

2. The spin valve sensor of claim 1 wherein the first and second multi-layer stacks each includes a first layer of antiferromagnetic material, a first layer of ferromagnetic material and a first layer of Ru.

3. The spin valve sensor of claim 2 wherein the first layer of ferromagnetic material in the first and the second multi-layer stacks is CoFe.

4. The spin valve sensor of claim 3 wherein the first and second multi-layer stacks each further comprise a second layer of ferromagnetic material, wherein the second layer of ferromagnetic material is CoFe.

5. The spin valve sensor of claim 3 wherein the first and second multi-layer stacks each further comprise a second layer of ferromagnetic material, wherein the second layer of ferromagnetic material is NiFe.

6. The spin valve sensor of claim 2 wherein the first and the second multi-layer stacks each further comprise a second layer of ferromagnetic material and a second layer of Ru.

7. The spin valve sensor of claim 2 wherein the thickness of the first layer of ferromagnetic material in the first and the second multi-layer stacks is about 20 angstroms.

8. The spin valve sensor of claim 7 wherein the thickness of the first layer of Ru in the first and the second multi-layer stacks is about 10 angstroms.

9. The spin valve sensor of claim 8 wherein the thickness of the second layer of ferromagnetic material is about 30 angstroms.

10. The spin valve sensor of claim 1, wherein the spin valve stack comprises:
    a first layer of ferromagnetic material;
    a second layer of ferromagnetic material, the second layer of ferromagnetic material having the first and second passive end regions separated by the central active region;
    a first layer of non-ferromagnetic material positioned between the first and second layers of ferromagnetic material; and
    a pinning layer positioned adjacent to the first layer of ferromagnetic material such that the pinning layer is in contact with the first layer of ferromagnetic material.

11. The spin valve sensor of claim 10 wherein the first layer of ferromagnetic material comprises a multi-layer synthetic antiferromagnet.

12. A spin valve sensor comprising:
    a first layer of ferromagnetic material;
    a second layer of ferromagnetic material, the second layer of ferromagnetic material having first and second passive end regions separated by a central active region;
    a first layer of non-ferromagnetic material positioned between the first and second layers of ferromagnetic material;
    a pinning layer positioned adjacent to the first layer of ferromagnetic material such that the pinning layer is in contact with the first layer of ferromagnetic material; and
    a first multi-layer stack extending on a top surface of the first passive end region to form a First synthetic antiferromagnet, and a second multi-layer stack extending on a top surface of the second passive end region to form a second synthetic antiferromagnet, the synthetic antiferromagnets producing a longitudinal bias in the passive end regions of a level sufficient to maintain the end regions in a single domain state.

13. The spin valve sensor of claim 12 wherein the first and second multi-layer stacks each includes a first layer of anti ferromagnetic material, a first layer of ferromagnetic material, and a first layer of Ru.

14. The spin valve sensor of claim 13 wherein the first layer of ferromagnetic material in the first and second multi-layer stacks is CoFe.

15. The spin valve sensor of claim 14 wherein the first and second multi-layer stacks each further comprise a second layer of ferromagnetic material.

16. The spin valve sensor of claim 15 wherein the second layer of ferromagnetic material of the first and second multi-layer stacks is CoFe.

17. The spin valve sensor of claim 15 wherein the second layer of ferromagnetic material of the first and second multi-layer stacks is NiFe.

18. The spin valve sensor of claim 15 wherein the first and second synthetic antiferromagnets each further comprise a second layer of Ru.

* * * * *